(12) United States Patent
Liao et al.

(10) Patent No.: US 9,236,273 B2
(45) Date of Patent: Jan. 12, 2016

(54) UV PROTECTION FOR LIGHTLY DOPED REGIONS

(71) Applicant: Taiwan Semiconductor Manufacturing Co., Ltd., Hsin-Chu (TW)

(72) Inventors: Chun Hao Liao, Hsinchu (TW); Chu Fu Chen, Hsinchu County (TW); Chin-Lung Chen, Hsinchu County (TW); Victor Chiang Liang, Hsinchu (TW); Mingo Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 17 days.

(21) Appl. No.: 13/937,423

(22) Filed: Jul. 9, 2013

(65) Prior Publication Data
US 2015/0014827 A1     Jan. 15, 2015

(51) Int. Cl.
| H01L 29/788 | (2006.01) |
| H01L 21/48  | (2006.01) |
| H01L 29/732 | (2006.01) |
| H01L 29/735 | (2006.01) |
| H01L 29/06  | (2006.01) |

(52) U.S. Cl.
CPC .......... *H01L 21/4814* (2013.01); *H01L 29/732* (2013.01); *H01L 29/735* (2013.01); *H01L 29/0692* (2013.01)

(58) Field of Classification Search
CPC . H01L 29/0692; H01L 29/735; H01L 29/732; H01L 21/4814
USPC ..................... 257/323, 431; 438/59
See application file for complete search history.

(56) References Cited

U.S. PATENT DOCUMENTS

| 5,338,969 | A  | * | 8/1994  | Kaya ............................. 257/659 |
| 6,162,583 | A  | * | 12/2000 | Yang et al. ..................... 430/313 |
| 6,313,502 | B1 | * | 11/2001 | Widdershoven .............. 257/323 |
| 8,324,713 | B2 |   | 12/2012 | Chen et al. |
| 2005/0275105 | A1 | * | 12/2005 | Lu et al. ........................ 257/758 |
| 2008/0315373 | A1 | * | 12/2008 | Yang ............................. 257/659 |

FOREIGN PATENT DOCUMENTS

| TW | 469431       | 12/2001 |
| TW | 200605187 A  | 2/2006  |

* cited by examiner

*Primary Examiner* — Trung Q Dang
(74) *Attorney, Agent, or Firm* — Eschweiler & Associates, LLC

(57) ABSTRACT

An integrated circuit device includes a lightly doped region such as the base region of a bipolar junction transistor within a semiconductor body. The device further includes a UV barrier layer formed over the lightly doped region. The UV barrier protects the lightly doped region from damage that can occur during high energy plasma etching or UV irradiation to erase EPROM.

20 Claims, 5 Drawing Sheets

UV PROTECTION FOR LIGHTLY DOPED REGIONS

FIELD

The present disclosure relates to integrated circuit (IC) devices having lightly doped regions such as the base regions for bipolar junction transistors. The disclosure also relates to methods of making and using such devices.

BACKGROUND

Bipolar junction transistors (BJTs) are commonly used in analog integrated circuit (IC) devices. A BJT includes two p-n junctions sharing a cathode or anode region. The shared region is called the base. The base is a lightly doped region. The base separates two regions of opposite conductivity type: the emitter and the collector. Depending on the conductivity types, a BJT can be of the NPN variety or the PNP variety.

Supplying a current to the base region of a BJT can induce a current of much greater magnitude between the emitter and the collector. The ratio between the current supplied to the base and the resulting current between emitter and collector can be referred to the gain of a BJT. The current between emitter and collector is the result of bidirectional flow of two type of charge carriers. Gain is reduced by recombination of these different types of charge carriers within the base region.

DETAILED DESCRIPTION

The inventors have found that UV exposure can create within the lightly doped base regions of BJTs active sites that accelerate charge carrier recombination and degrade the BJTs' performance. The UV exposure can occur incidentally over the course of manufacturing during, for example, high energy plasma etching. The UV exposure can also occur intentionally subsequent to manufacture during, for example, UV irradiation to erase erasable programmable read-only memory (EPROM).

The present disclosure provides UV protection for BJTs and other IC devices having lightly doped regions that can be adversely affected by UV irradiation. The protection is provided by one or more UV barrier layers formed over the vulnerable regions prior to exposure.

Figure 1:
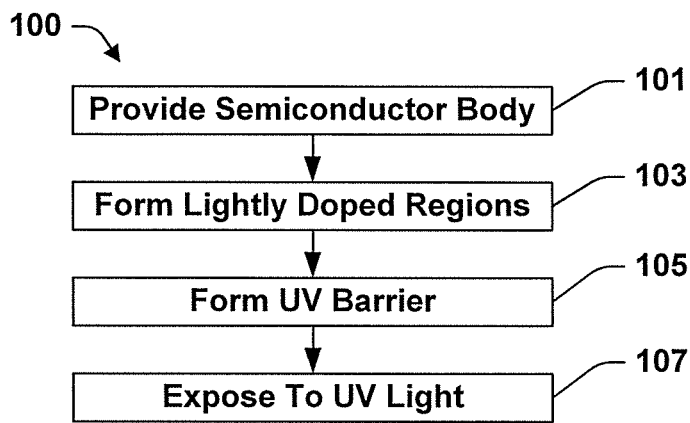
FIG. 1 is a flow chart of a method according to an embodiment of the present disclosure.

FIG. 1 provides a flow chart of a method 100 of making and using an IC device with UV shielding according to one embodiment of the present disclosure. The method 100 includes act 101, providing a semiconductor body, act 103, forming a lightly doped region within the semiconductor body, act 105, forming a UV barrier over the lightly doped region, and act 107, exposing the device to UV radiation. The lightly doped region is one having a functionality that is adversely affected by exposure to UV radiation.

Figure 2:
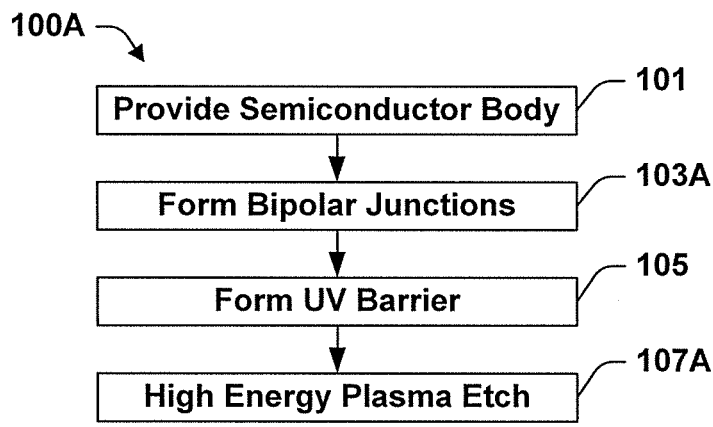
FIG. 2 is a flow chart of a method according to some embodiments of the present disclosure.
Figure 4:
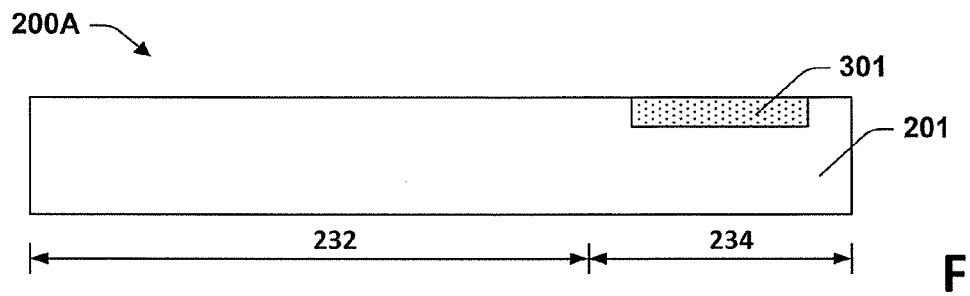
FIGS. 4-6 illustrate a device according to an embodiment of the present disclosure as it undergoes processing according to the method of FIG. 2.
Figure 5:
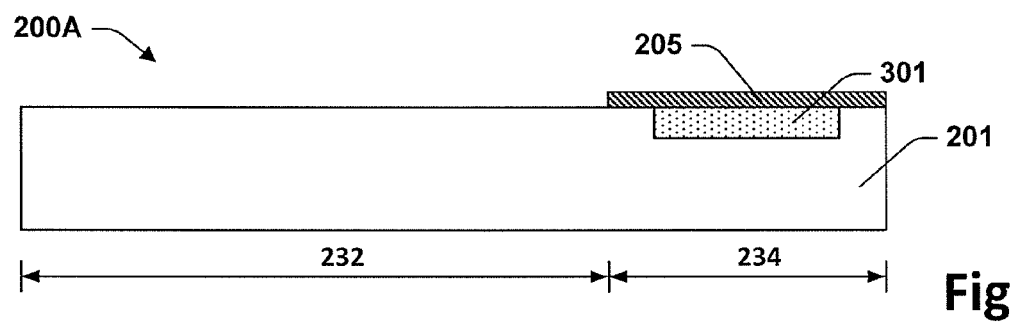
Figure 6:
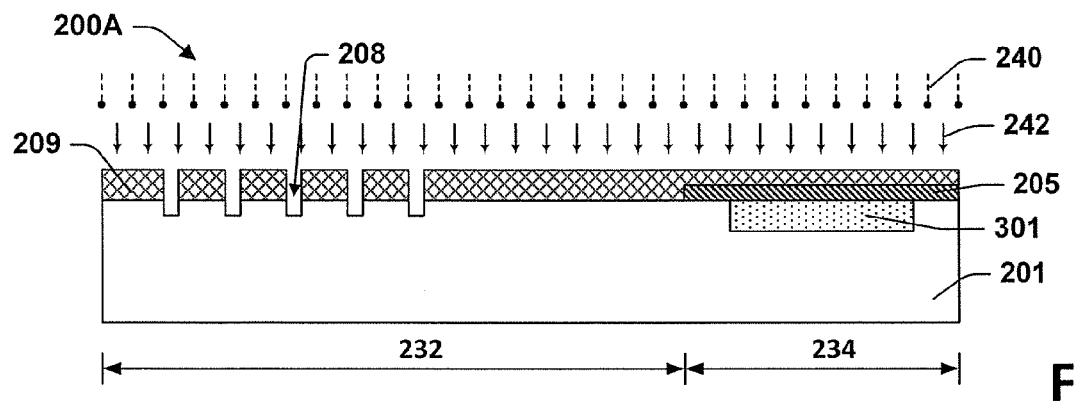

FIG. 2 provides a flow chart of a method 100A according to one group of embodiments within the scope of the method 100. FIGS. 4-6 illustrate a device 200A as it undergoes undergoing processing according to the method 100A. The method 100A includes act 103A, which is forming a BJT 301, which includes a lightly doped base region, within a semiconductor body 201 to provide a structure as illustrated by FIG. 4. The semiconductor body 201 includes distinct regions 232 and 234. The BJT 301 is formed within region 234.

The method 100A continues with act 105, which is forming a UV barrier 205 over the region 234 and the BJT 301 as illustrated by FIG. 5. The UV barrier 205 can include one or more layers collectively functional to shield BJT 301 from UV radiation. In some embodiments, the UV barrier 205 extends over region 232. In some other embodiments, the UV barrier 205 is restricted to the region 234.

The method 100A continues with act 107A, which is high energy plasma etching that exposes the device 200A to UV radiation as illustrated by FIG. 6. The etch 107A can form trenches 208 within the semiconductor body 201. A mask 209 is typically provided to block plasma 240 from portions of the semiconductor body 201 where trenches 208 are not desired. While the mask 209 blocks plasma 240, it is not effective to block UV radiation 242, which is generated by the plasma 240. The UV barrier 205 blocks most of the UV radiation 242 incident on the region 234. The mask 209 can be patterned by photolithography. If the UV barrier 205 extends into the region 232, patterning the mask 209 can include patterning openings though the UV barrier 205. Absent the UV barrier 205, UV radiation 242 would adversely affect BJT 301, for example, by reducing its gain by 5% or more. The UV barrier 205 prevents UV radiation 242 from adversely affecting BJT 301.

Figure 3:
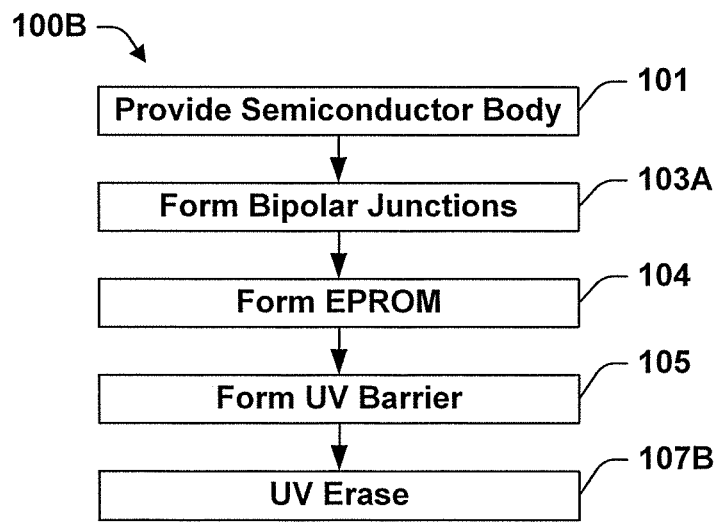
FIG. 3 is a flow chart of a method according to some other embodiments of the present disclosure.
Figure 7:
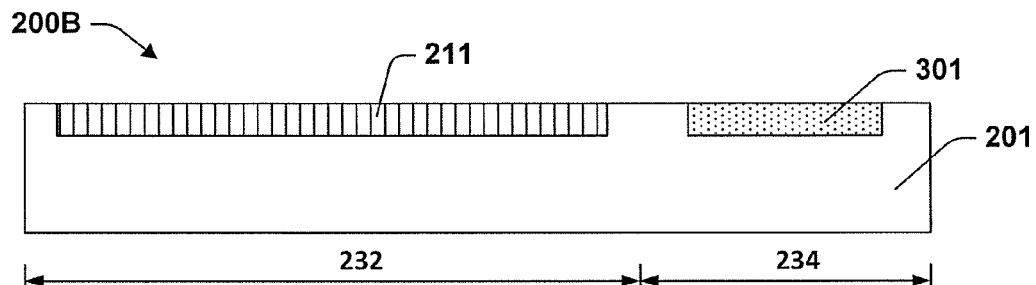
FIGS. 7-9 illustrate a device according to another embodiment of the present disclosure as it undergoes processing according to the method of FIG. 3.
Figure 8:
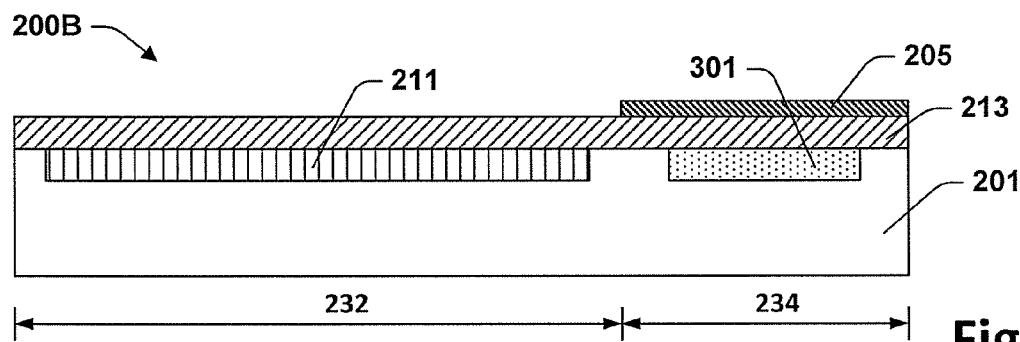
Figure 9:
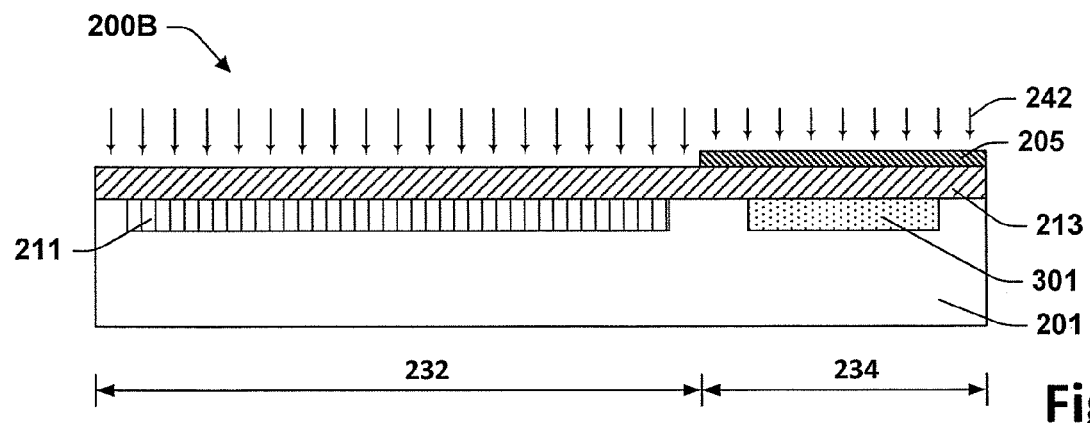

FIG. 3 provide a flow chart of a method 100B according to another group of embodiments within the scope of the method 100. FIGS. 7-9 illustrate a device 200B as it undergoes undergoing processing according to the method 100B. As with the method 100A, method 100B begins with act 101, providing a semiconductor body 201 including regions 232 and 234. The method 100B continues with act 103A, forming BJTs 301 including lightly doped base regions within the region 234, and act 104, forming EPROM 211 within the region 232 as illustrated by FIG. 7. These two acts can occur in any order.

The method 100B continues with act 105, forming a UV barrier 205 over the region 234 and the lightly doped base region 301 as illustrated by FIG. 8. While in some embodiments the UV barrier 205 extends over part of the region 232, the UV barrier 205 does not extend over EPROM 211. In some other embodiments, the UV barrier 205 is restricted to the region 234. EPROM 211 can be formed after the UV barrier 205.

Following completion of the formation of the device 200B, the method 100B continues with act 107B, UV irradiation to erase the memory 211 as illustrated by FIG. 9. The UV light 242 is incident on the region 234, but is substantially blocked from BJT 301 by UV barrier 205. In some embodiments, UV barrier 205 blocks at least 90% of the UV radiation incident on the region 234.

In some embodiments, the UV radiation of act 107 would cause at least a 5% reduction in gain for a BJT 301 for at least one rate of current injection into its base. In some embodiments, the UV barrier 205 lessens this reduction in gain to an insignificant level, which is a level below 5%. The BJT 301 can be of the NPN type or the PNP type. The BJT can have any suitable structure.

Figure 10:
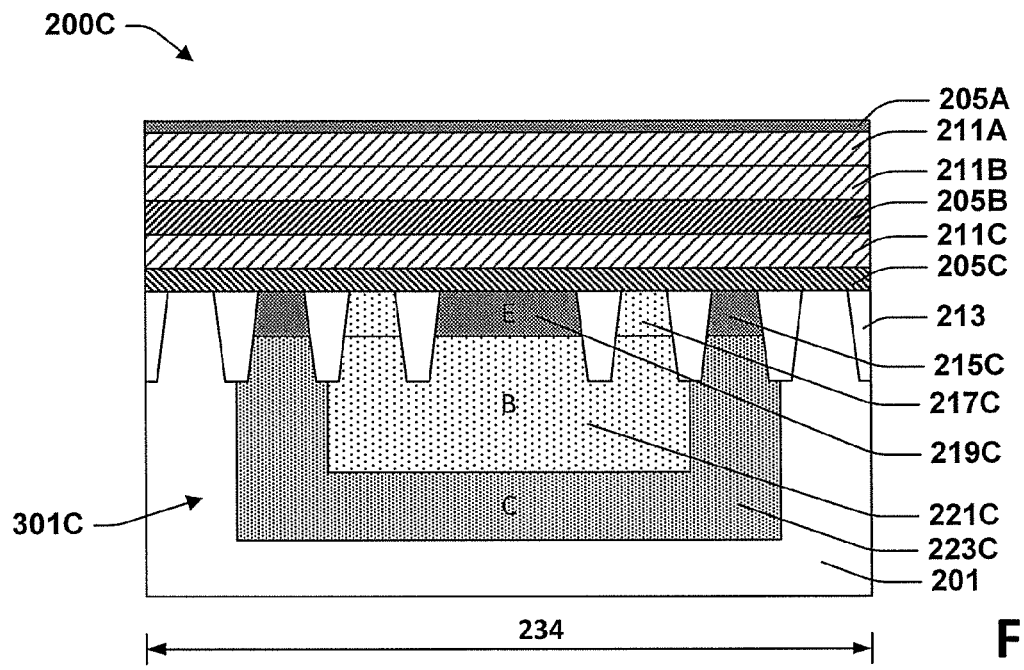
FIG. 10-11 illustrate a device according to some embodiments of the present disclosure.
Figure 11:
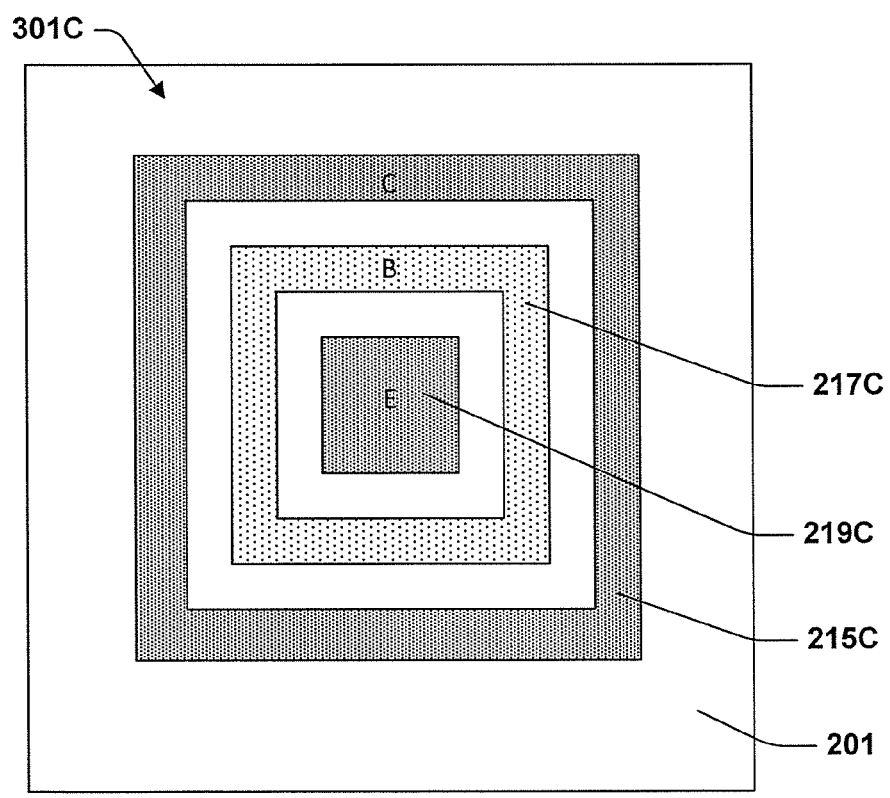

In some embodiments, the BJT 301 is of the vertical type. FIG. 10 illustrates a device 200C, which include vertical type BJT 301C and provides an example according to these embodiments. The device 200C can also be a device according to the embodiments represented by the devices 200A and 200B. FIG. 11 provides a plan view of the BJT 301C. BJT 301C include emitter 219C, base 221C, and collector 223C, which are doped regions of the semiconductor body 201.

The base 221C is a lightly doped region. The emitter 219C and the collector 223C can be more heavily doped and have an opposite doping type from the base 221C. The region 217C provides a contact for the base 221C and can be doped more heavily than the base 221C. The region 215C provides a contact for the collector 223C. These contacts are separated by isolations regions 213.

The device 200C illustrates three layers, all of which or any one of which can provide the UV barrier 205. The layer 205C is a dielectric layer formed over the surface of the semiconductor body 201. This layer 205C is formed at an earlier stage of processing and generally provides the UV barrier 205 for embodiments according to the method 100A of FIG. 2 and for the device 200A of FIGS. 4-6.

The layer 205B is a damascene interconnect layer formed among other interconnect layers, represented by layer 211A, 211B, and 211C. The layer 205B can be any one of these interconnect layers, or more than one of these interconnect layers. The layer 205A is formed over the metal interconnect layers 211. In some embodiment the layer 205A is a metal layer. In other embodiment, the layer 205A is a dielectric layer.

Figure 12:
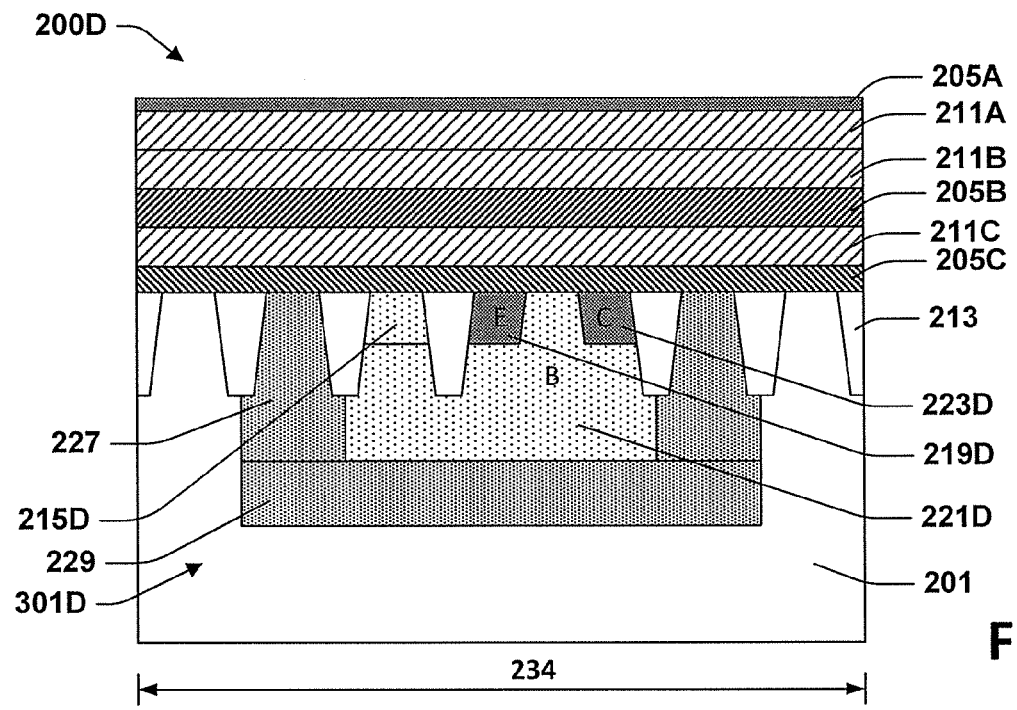
FIG. 12-13 illustrate another device according to some other embodiments of the present disclosure.
Figure 13:
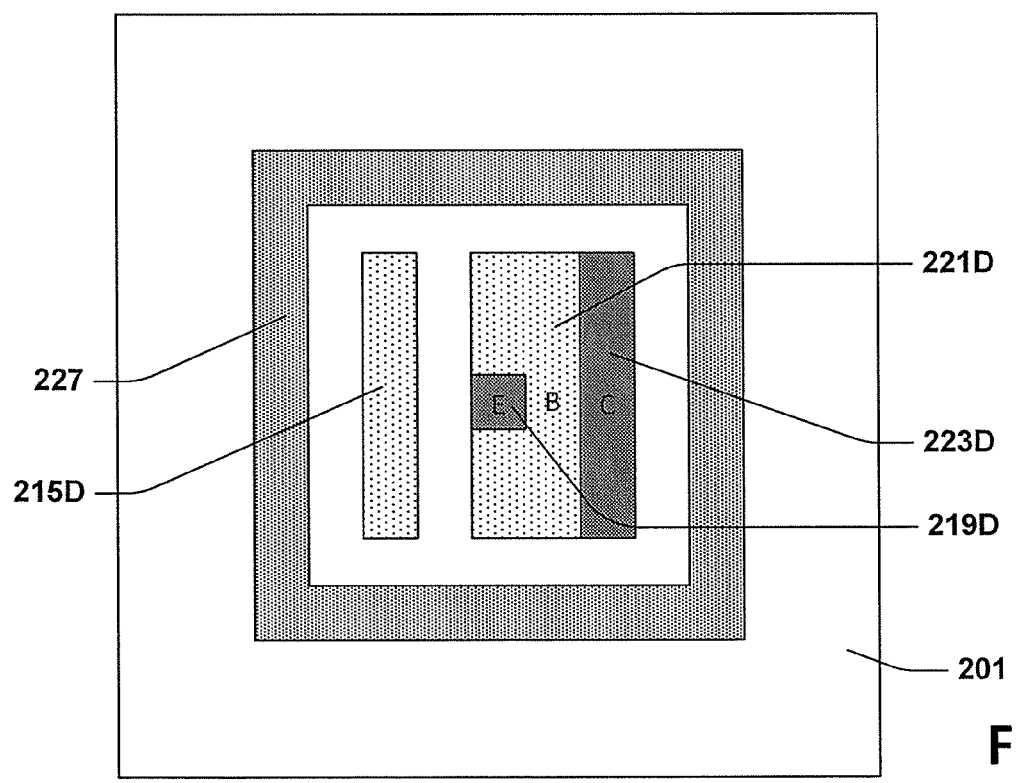

In some embodiments, the BJT 301 is of the lateral type. FIG. 12 illustrates a device 200D, which includes lateral type BJT 301D and provides an example according to these embodiments. The device 200D can also be a device according to the embodiments represented by the devices 200A and 200B. FIG. 13 provides a plan view of the BJT 301D. BJT 301D include emitter 219D, base 221D, and collector 223D, which are doped regions of the semiconductor body 201.

The base 221D is a lightly doped region. The emitter 219D and the collector 223D can be more heavily doped and have an opposite doping type from the base 221D. The region 215D provides a contact for the base 221D and can be doped more heavily than the base 221D. BJT 221D is formed within a well that is formed by regions 227 and 229, which are regions having an opposite doping type from the base 221D.

The regions 227 and 229 can have any suitable structure. In one embodiment, the regions 227 and 229 are formed by a single deep well implant. In some other embodiments, the region 229 is a buried layer of doped semiconductor, while the regions 227 are doped by ion implantation. These same alternatives can be applied to forming the collector region 223C for BJT 301C.

The UV barrier 205 is a structure functional to effectively protect BJTs 301 from UV radiation. In some embodiments, effective protection requires blocking at least 90% of any incident UV radiation from BJTs 301.¹ In some embodiments, the UV barrier 205 is effective to block at least 95% of any incident UV radiation. For purposes of this specification, UV radiation is light having a wavelength between 40 and 400 nm. The UV barrier 205 can be formed by any suitable method or combination of methods including, for example, chemical vapor deposition, physical vapor deposition, (e.g. sputtering, electron beam evaporation, and ion plating), plasma spray techniques, and sol-gel processes.

In some embodiments, the UV barrier layer 205 includes a metal layer. Examples of metals that can provide effective UV barriers include Aluminum-Copper (AlCu), Aluminum (Al), Chromium (Cr), Nickel (Ni), Tantalum (Ta), Titanium (Ti), and Tungsten (W). In some embodiments, the UV barrier layer 205 includes a boride, carbide, nitride, oxide, phosphide, silcide, or sulfide of a metal. Examples include Nickel Silicide (NiSi), Tantalum Boride (TaB), Tantalum Germanium (TaGe), Tantalum Nitride (TaN), Tantalum Silicide (TaSi), Tantalum Silicon Nitride (TaSiN), and Titanium Nitride (TiN). Examples of metal oxides that can form effective UV barriers include titanium dioxide, zinc oxide, cadmium oxide, and tungsten trioxide.

In some embodiments, the UV barrier layer 205 includes a dielectric layer. In some embodiments the dielectric UV barrier is an organic compound and in some other embodiments the dielectric UV barrier is an inorganic compound. Examples of organic compounds that can provide UV barrier 205 include phenolic and cyanoacrylate derivatives. Additional examples of organic compounds that can provide UV barrier 205 include polymethylmethacrylate, polyethylmethacrylate, polyvinylbutyral, polyvinylacetate and copolymers of vinyl butyral, polyvinyl alcohol and polyvinylacetate. Examples of inorganic compounds that can provide UV barrier 205 include glasses with a sufficiently high content of a metal or metal oxide that is a good adsorber of UV light.

The device 200 (inclusive of devices 200A, 200B, 200C, and 200D) typically includes an analog circuit. In some embodiments, the device 200 includes one or more of a bias circuit, a band gap reference circuit, an op-amp circuit, a BiCMOS circuit, and a high voltage circuit. These circuits generally include BJTs 301 and can be adversely affected by UV irradiation absent shielding provided by the present disclosure.

A semiconductor body can have any suitable structure. Examples of suitable structures include single crystal structures and semiconductor on insulator (SOI) structure. Examples of semiconductors include, without limitation, Si, SiGe, Ge, InP, InGaAs, InAs, and GaSb.

The present disclosure provides an integrated circuit device that includes a lightly doped region such as the base region of a bipolar junction transistor within a semiconductor body. The device further includes a UV barrier layer formed over the lightly doped region.

The present disclosure provides a method of manufacturing an integrated circuit device. The method includes forming a lightly doped region within a semiconductor body and forming a UV barrier layer over the lightly doped region The present disclosure provides a method of using a semiconductor device. The method includes forming a lightly doped region within the semiconductor body, covering the lightly doped region with a UV barrier layer, and exposing the device to UV radiation.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
   a semiconductor body;
   a bipolar junction transistor comprising a lightly doped region within the semiconductor body;
   a plurality of metal interconnect layers disposed over the bipolar junction transistor; and
   a UV barrier layer disposed over the metal interconnect layers.

2. The integrated circuit device of claim 1, wherein the lightly doped region provides a base region for the bipolar junction transistor.

3. The integrated circuit device of claim 1, wherein the UV barrier layer comprises AlCu.

4. The integrated circuit device of claim 1, wherein the UV barrier layer is a metal layer.

5. The integrated circuit device of claim 1, wherein the device comprises erasable programmable read only memory.

6. An integrated circuit device, comprising:
   a semiconductor body;
   a bipolar junction transistor disposed within the semiconductor body; and
   a UV barrier layer disposed over the bipolar junction transistor;
   wherein the UV barrier layer covers all active areas of the bipolar junction transistor.

7. A method of manufacturing an integrated circuit device, comprising:
   providing a semiconductor body;
   forming a bipolar junction transistor comprising a lightly doped region within the semiconductor body;
   forming a plurality of metal interconnect layers over the lightly doped region; and
   forming a UV barrier layer over the lightly doped region and the metal interconnect layers.

8. A method of manufacturing an integrated circuit device, comprising:
   providing a semiconductor body;
   forming a bipolar junction transistor comprising a lightly doped region within the semiconductor body; and
   forming a UV barrier layer covering the lightly doped region;
   wherein after forming the UV barrier layer, the device is etched using a high density plasma that induces UV irradiation to the device.

9. The method of claim 7, wherein the lightly doped region provides a base region for the bipolar junction transistor.

10. The method of claim 7, wherein the UV barrier layer comprises AlCu.

11. The method of claim 7, wherein the UV barrier layer is a metal layer.

12. The method of claim 7, further comprising exposing the device to UV radiation.

13. The method of claim 12, wherein the UV radiation erases erasable programmable read only memory within the device.

14. The method of claim 7, wherein the UV barrier layer covers all active areas of the device.

15. The integrated circuit device of claim 1, wherein the UV barrier layer is a dielectric layer.

16. The integrated circuit device of claim 5, wherein the UV barrier layer covers the bipolar junction transistor but leaves the erasable programmable read only memory open.

17. An integrated circuit device, comprising:
   a semiconductor body;
   a first region comprising a bipolar junction transistor disposed within the semiconductor body; and
   a second region adjacent to the first region, comprising an erasable programmable read only memory;
   a UV barrier layer disposed directly above the bipolar junction transistor and not overlying the erasable programmable read only memory.

18. The integrated circuit device of claim 17, wherein the UV barrier layer comprises a dielectric layer abutting an upper surface of the semiconductor body.

19. The integrated circuit device of claim 17, wherein the UV barrier layer comprises a metal layer disposed among a plurality of interconnect layers.

20. The integrated circuit device of claim 17, wherein the UV barrier layer covers all active areas of the bipolar junction transistor.

* * * * *